United States Patent [19]

Kameyama

[11] Patent Number: 4,472,240

[45] Date of Patent: Sep. 18, 1984

[54] METHOD FOR MANUFACTURING SEMICONDUCTOR DEVICE

[75] Inventor: Shuichi Kameyama, Yokohama, Japan

[73] Assignee: Tokyo Shibaura Denki Kabushiki Kaisha, Japan

[21] Appl. No.: 410,081

[22] Filed: Aug. 19, 1982

[30] Foreign Application Priority Data

Aug. 21, 1981 [JP] Japan .................................. 56-131016
Aug. 27, 1981 [JP] Japan .................................. 56-133367
Jan. 29, 1982 [JP] Japan .................................. 57-12820

[51] Int. Cl.³ .............. H01L 21/306; B44C 1/22; C03C 15/00; C03C 25/06
[52] U.S. Cl. ................. 156/648; 29/576 W; 29/580; 148/187; 156/651; 156/653; 156/657; 156/659.1; 156/661.1; 156/662; 357/49; 427/93; 430/316
[58] Field of Search ........... 29/571, 576 W, 578, 29/580; 148/1.5, 187, 175; 427/88, 89, 90, 93; 430/312, 313, 316, 317; 156/648, 649, 651, 652, 653, 657, 659.1, 661.1, 662; 357/49, 50

[56] References Cited

U.S. PATENT DOCUMENTS

| | | | |
|---|---|---|---|
| 3,753,803 | 8/1973 | Nomura et al. | 156/648 X |
| 3,767,493 | 10/1973 | Kump | 156/651 |
| 4,040,891 | 8/1977 | Chang et al. | 156/651 |
| 4,140,558 | 2/1979 | Murphy et al. | 156/648 X |
| 4,397,075 | 8/1983 | Fatula et al. | 156/647 X |

FOREIGN PATENT DOCUMENTS

5338981  9/1976  Japan .
56-103446 1/1980  Japan .

Primary Examiner—William A. Powell
Attorney, Agent, or Firm—Finnegan, Henderson, Farabow, Garrett & Dunner

[57] ABSTRACT

A method for forming a groove in a semiconductor substrate is disclosed. The groove is formed in two steps. In the first step, a first shallow groove is formed in the semiconductor substrate and then a first mask pattern is selectively formed on the wall of the first groove. A second groove is formed in the bottom surface of the first groove using the first mask pattern as a mask. Subsequently the first mask is etched off. The obtained groove may be buried with an insulating material or an electrode material.

13 Claims, 59 Drawing Figures

METHOD FOR MANUFACTURING SEMICONDUCTOR DEVICE

BACKGROUND OF THE INVENTION

The present invention relates to a method for manufacturing a semiconductor device and, more particularly, to a method for forming a contact hole for an electrode region or a groove for an element isolation region of an IC or LSI.

P-n junction isolation and selective oxidation have been used as methods for isolating semiconductor elements, especially in the manufacture of bipolar ICs and MOSICs.

However, the above methods have the following drawbacks. For example, in the p-n junction isolation method, lateral diffusion is so great that the packing density is lowered. In the selective oxidation method, an increase in stress due to lateral oxidation at the edge of a field oxide layer results in crystal defects. Lateral oxidation of the film degrades patterning, so that a high packing density cannot be achieved.

Figure 1:
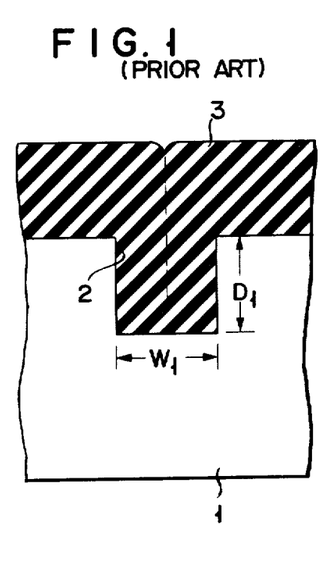
FIGS. 1 and 2 are sectional views for explaining a conventional method for forming a element isolation region.
Figure 2:
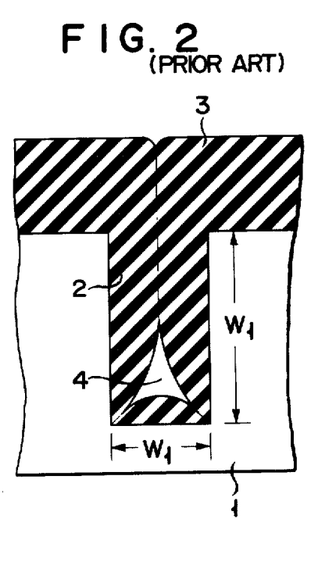

In consideration of the above drawbacks, the present inventors have previously proposed the following element isolation method. As shown in FIG. 1, a U-shaped groove 2 is formed in a semiconductor layer 1. The groove 2 has a depth D1, a width W1, and has vertical or substantially vertical walls. In this case, if the ratio of the depth D1 to the width W1 (D1/W1) is relatively small, the groove 2 is gradually filled by an insulating film 3, provided a thickness of the insulating film 3 is sufficiently greater than half the width W1 of the groove 2. As a result, the surface of the insulating film 3 becomes flat. Thereafter, the insulating film 3 is selectively etched to expose one major surface of the semiconductor layer 1 to form an insulating isolation region in the groove 2, although the etching process is not illustrated in FIG. 1. In this method, if the depth D1 is increased with respect to the width W1, a cavity 4 is formed in the insulating film 3 inside a groove 2'. This is because the deposition components of the insulating film are not always deposited vertically with respect to one major surface of the semiconductor layer. Some of the components are obliquely deposited in the groove 2' and cannot enter the deeper portion thereof. As a result, some of the components are deposited near the surface of the groove 2'.

A method has also been proposed for forming an element isolation region which comprises an insulator deposited in a Y-shaped groove.

Figure 3A:
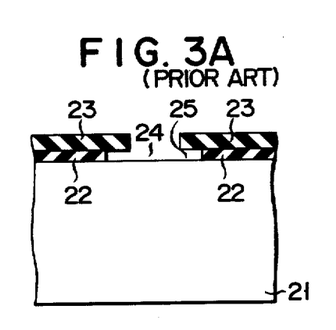
FIGS. 3A to 3E are sectional views for explaining the steps of another method of manufacturing another conventional element isolation region.

Referring to FIG. 3A, an $SiO_2$ film 22 of about 1,000Å thickness and an $Si_3N_4$ film 23 of about 3,000Å thickness are sequentially deposited on a silicon semiconductor layer 21 with a (100) plane. The $Si_3N_4$ film 23 is then selectively etched by photoetching to form a hole 24. The $SiO_2$ film 22 is then overetched using the $Si_3N_4$ film 23 as a mask, to form a hole 25 whose diameter is larger than that of the hole 24 (FIG. 3A).

Figure 3B:
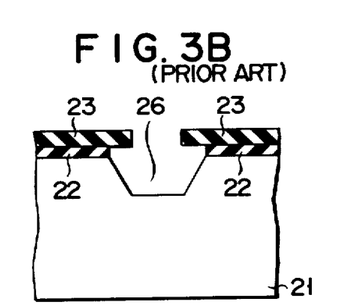
Figure 3C:
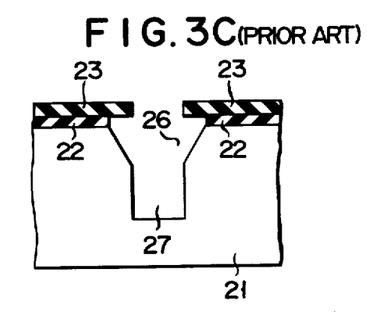

The exposed part of the silicon semiconductor layer 21 is then etched by an anisotropic etchant of the KOH type with the $SiO_2$ film 22 serving as a mask to form a first groove 26 having a tapered shape (FIG. 3B). Subsequently, that part of the silicon semiconductor layer 21 which corresponds to the first groove 26 is etched by anisotropic etching such as the reactive ion etching method to form a second groove 27 (FIG. 3C).

Figure 3D:
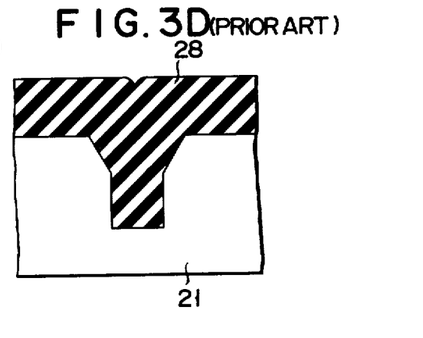
Figure 3E:
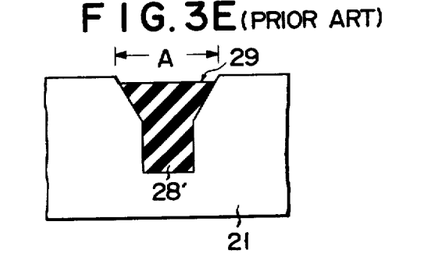

After the $Si_3N_4$ film 23 and the $SiO_2$ film 22 are removed, an isolation region formation film 28 such as an $SiO_2$ film is deposited to fill the first and second grooves 26 and 27 and to cover the entire surface (FIG. 3D). The isolation region formation film 28 is then etched to expose the one major surface of the semiconductor layer 21 to leave isolating material 28' in the first and second grooves 26 and 27. Thus, an element isolation region 29 is formed (FIG. 3E).

According to the latter method, since the Y-shaped groove comprises the first and second grooves 26 and 27, the isolating film is properly formed to provide excellent step coverage. The cavity 4 shown in FIG. 2 may not be formed. However, the following drawbacks are presented:

(1) Since a width A of the first groove is determined by the width of the hole 25 when the exposed portion of the $SiO_2$ film 22 is overetched using the $Si_3N_4$ film 23 as the mask, the width A of the first groove 26 may change in accordance with the degree of etching. Hence, the width of the element isolation region 29 can hardly be controlled.

(2) Since the tapered portion of the first groove 26 of the semiconductor layer 21 as shown in FIG. 3B which will form the isolation region of the MOS semiconductor device is covered with the $Si_3N_4$ film 23, it is difficult to ion-implant impurities for formation of a channel stopper in the tapered portion of the groove. In order to form such a channel stopper in the tapered portion, the second groove 27 must be formed in FIG. 3C. After the $Si_3N_4$ film 23 is etched, ion-implantation is performed using the $SiO_2$ film 22 with the hole 24 as the mask. Thus, the channel stopper is formed in the tapered portion. However, the channel stopper is also formed at the bottom of the groove; it is impossible to form the channel stopper only in the tapered portion.

When a contact hole of a diameter substantially the same as the thickness of the field film on the semiconductor layer is formed for connection of an electrode of the semiconductor device, the diameter of the hole is inadvertently increased if the conventional isotropic etching method and the tapered etching method are used. This is undesirable from the viewpoint of micropatterning. In order to solve the above problem, anisotropic etching such as reactive ion etching is used. However, this increases the depth of the hole with respect to its width; step coverage of the electrode material is degraded as described with reference to FIG. 2, thus forming a cavity therein.

SUMMARY OF THE INVENTION

The present invention has been made in consideration of the above situations and has for its object to provide a method for forming a contact hole or an element isolation region in a self-aligned manner with excellent controllability without forming a cavity therein.

In order to achieve the above object of the present invention, there is provided a method for manufacturing a semiconductor device, comprising the steps of:

selectively forming a first groove in a semiconductor layer or in an insulating layer which is formed on a semiconductor layer;

selectively retaining a first mask pattern on a side wall of said first groove;

forming a second groove by selectively etching a bottom surface of said first groove using said first mask pattern as a mask; and etching said first mask pattern retained on the side wall of said first groove.

BRIEF DESCRIPTION OF THE DRAWINGS

FIGS. 4A to 4I are sectional views for explaining the steps of manufacturing an element isolation region according to one embodiment of the present invention;

DETAILED DESCRIPTION OF THE PREFERRED EMBODIMENTS

Figure 4A:
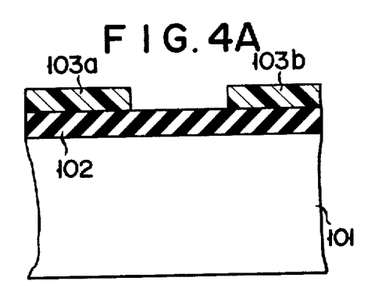

One embodiment in which an element isolation region is formed will be described with reference to FIGS. 4A to 4H. A mask film 102 is deposited on a semiconductor layer 101. The mask film 102 may comprise a silicon nitride film of 3,000 to 5,000Å thickness. A low melting point insulating film such as a phosphorus silicate glass film, a boron silicate glass film or a metal film may be used as the mask film. A thin film (not shown) thinner than the mask film 102 may be formed between the mask film 102 and the semiconductor layer 101. In this case, the thin film comprises a silicon oxide film of about 500Å thickness, and the mask film comprises a polycrystalline silicon film of about 3,000 to 5,000Å thickness. Photoresist patterns 103a and 103b are formed on a portion of the mask film 102 excluding a prospective groove (FIG. 4A).

Figure 4B:
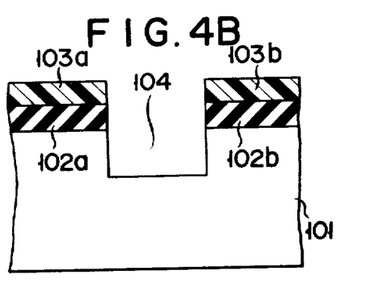
Figure 4C:
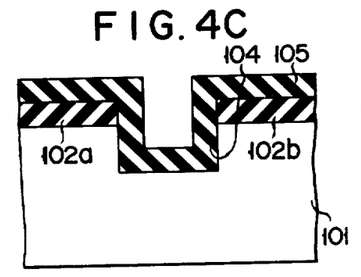

The mask film 102 is selectively etched using the photoresist patterns 103a and 103b to form mask patterns 102a and 102b. Further, the semiconductor layer 101 is etched to form a first groove 104 (FIG. 4B). In this case, anisotropic etching such as reactive ion etching can be adopted to form the vertical or substantially vertical walls of the etching portion and hence of the first groove 104. Note that other etching means may be used to form tapered walls as will be described later.

Figure 4D:
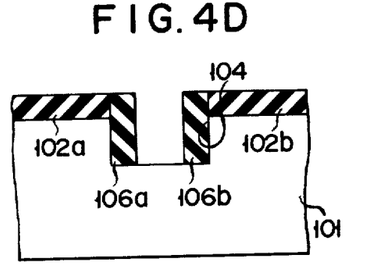

After the photoresist patterns 103a and 103b are removed, a thin mask film 105 having a thickness smaller than half of the width of the first groove 104 is deposited on the mask patterns 102a and 102b and on the side walls and bottom surface of the first groove 104 (FIG. 3C). The thin mask film 105 may comprise a CVD-SiO$_2$ film, a polycrystalline silicon film, or a metal film which can be selectively etched relative to the semiconductor layer 101. The thin mask film 105 is then etched by anisotropic etching in the vertical direction with respect to the major surface of the semiconductor layer 101, allowing retention of the thin mask film portion on the side walls of the first groove 104. Thus, mask patterns 106a and 106b are formed (FIG. 4D). At this time, part of the semiconductor layer 101 at the bottom of the first groove 104 is exposed.

Figure 4E:
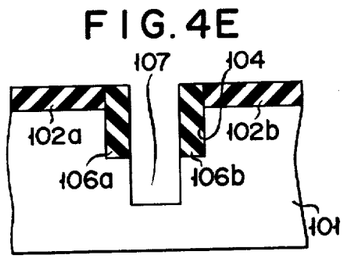
Figure 4F:
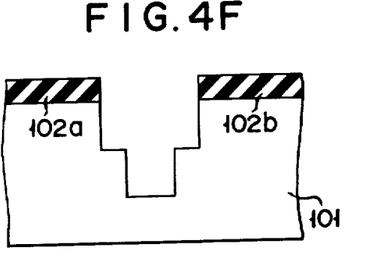

This exposed portion of the semiconductor layer 101 on the bottom surface of the first groove 104 is etched using the mask patterns 106a and 106b as masks, so that a second groove 107 is formed (FIG. 4E). In this case, anisotropic etching is used to form the vertical or substantially vertical walls of the second groove 107.

Figure 4G:
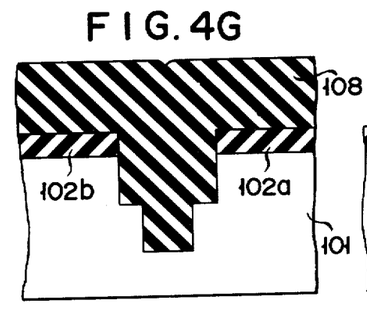

After the mask patterns 106a and 106b on the walls have been etched by isotropic etching (FIG. 4F), an isolation region formation film 108 is sufficiently deposited to cover the first and second grooves 104 and 107 and to have a thickness on the surface of the mask patterns 102a and 102b greater than half of the width of the first groove (FIG. 4G). Note that the isolation region formation film 108 fills in the second groove 107 without forming a cavity, and then fills in the first groove 104 without forming a cavity. The isolation region formation film 108 may be formed by one of the following methods: a method for depositing an insulating material by CVD or PVD, a method for forming an insulating film by directly oxidizing the semiconductor layer 101, and a method for forming an insulating film by depositing polycrystalline silicon to fill the first and second grooves and then oxidizing it. The above insulating films may comprise SiO$_2$, Si$_3$N$_4$, or Al$_2$O$_3$. For this purpose, a low-melting point insulating material such as silicate glass and boron silicate glass may also be used. Alternatively, prior to deposition of an insulating material, the entire surface of the semiconductor layer or at least part of the groove may be oxidized or nitrified to form an oxide film or a nitride film which does not fill the groove. An element isolation region obtained by this method comprises high density layers of the oxide film or the nitride film and the insulating film, and is firmly adhered to and densified on the semiconductor layer, so that its element isolation function is greatly improved as compared with that of an isolation layer having only deposited insulating material.

After forming an insulating layer on the surface of the groove as mentioned above, the groove may be filled with an electrically conductive material. Further, after the insulating material is deposited, a low-melting point impurity such as boron, phosphorus or arsenic may be doped in part of the surface of the isolation region formation film, and the doped impurity may be diffused by annealing. Alternatively, a low-melting point insulating material such as boron silicate glass (BSG), phosphorus silicate glass (PSG) or arsenic silicate glass (AsSG) may be deposited on the isolation region formation film and be melted. With the above process, even if the groove remains recessed after the insulating material is deposited, the groove may be filled further with a low-melting point material to obtain a flat surface.

Figure 4H:
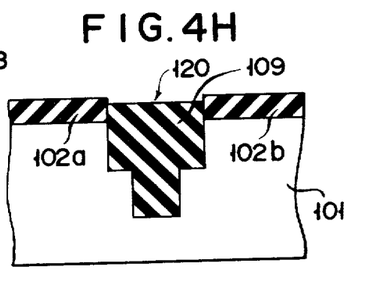

The isolation region formation film 108 on the mask patterns 102a and 102b is etched by reactive ion etching or non-selective etching using a plasma etchant or wet etchant until the surfaces of the mask patterns 102a and 102b are exposed. Thus, an isolating material 109 remains in the first and second grooves 104 and 107 to form an element isolation region 120 (FIG. 4H). Note that, preferably, the above etchant does not substantially etch the mask patterns 102a and 102b.

The mask patterns 102a and 102b on the semiconductor layer 101 are then completely etched by an etchant which does not substantially etch the isolating material 109 embedded in the first and second grooves 104 and 107. At this time, if the thin film described above is formed under the mask film patterns 102a and 102b, the thin film must also be etched to expose the surface of the semiconductor layer 101. As shown in FIG. 4I, the top of the isolation material 109 in the element isolation region 120 extends from the surface of the semiconductor layer 101. The side surfaces of the extended portion have a vertical or substantially vertical shape. Therefore, even if a junction is formed in contact with the element isolation region, degradation in the junction characteristics may be prevented since the substantially vertical side surfaces of the semiconductor layer are not exposed.

As will be explained later with reference to FIG. 7, a thin insulating film (not shown) having a thickness of 2,000 to 3,000Å may be formed to cover the entire surface of the semiconductor layer and the extended element isolation region. Thereafter, anisotropic reactive ion etching may be performed to retain portions of the thin film only on the vertical side walls or surfaces. Thus, the side surfaces of the semiconductor layer at the groove may not be exposed.

According to the method of the present invention, semiconductor elements are completely isolated by the extended element isolation region. Further, by repeating the above process, a multi-stepped groove structure can be readily obtained.

In the above embodiment, the side walls of the first groove are vertically formed by anisotropic etching. However, as shown in FIGS. 5A to 5H, the side surfaces of the first groove may be tapered.

Figure 5A:
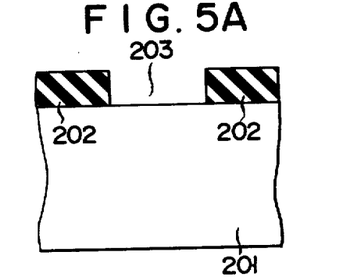
FIGS. 5A to 5H, FIG. 6 and FIG. 7 are sectional views for explaining the steps of manufacturing an element isolation region according to another embodiment of the present invention.

Referring to FIG. 5A, a mask film 202 is deposited on a semiconductor substrate (or semiconductor layer) 201. The mask film 202 is etched by photoetching to form mask patterns 202 and a hole 203 in a prospective groove formation region.

Figure 5B:
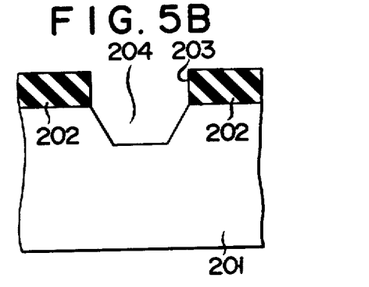

An exposed portion of the semiconductor substrate 201 is etched using the mask patterns 202 to form a first groove 204 with tapered side surfaces (FIG. 5B).

The cross-section of the first groove 204 need not be limited to an inverted trapezoidal shape, but may be extended to a V shape. Impurities having the same conductivity type as the semiconductor substrate 201 may be ion-implanted using the mask patterns 202 as masks. By ion-implantation, an impurity region is formed on the tapered side surfaces of the first groove 204. Note that the bottom of the first groove is etched by the subsequent step, so that the impurity region is left only on the tapered side surfaces of the first groove 204.

Figure 5C:
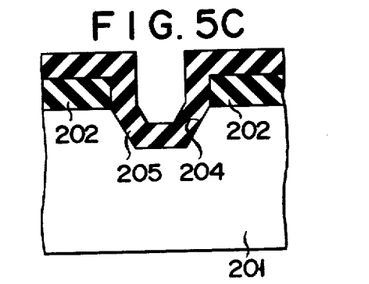
Figure 5D:
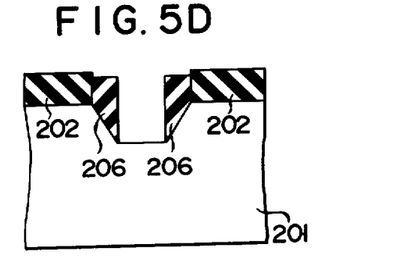

A thin mask film 205 for forming mask patterns is deposited on the mask patterns 202 and in the first groove 204 to a thickness smaller than half of the width of the groove 204 (FIG. 5C). The thin mask film 205 is then vertically etched by anisotropic etching to the thickness of the thin film 205 on the mask patterns 202, so that the thin film only on the tapered walls of the first groove 204 remains to form mask patterns 206 (FIG. 5D). At this time, part of the semiconductor substrate 201 is exposed, being the bottom surface of the first groove 204.

Figure 5E:
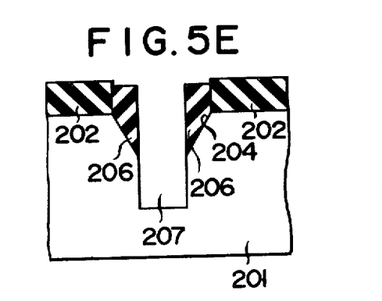

The exposed portion of the semiconductor substrate 201 on the bottom surface of the first groove 204 is etched using the mask patterns 202 and the mask patterns 206 as masks to form a second groove 207 (FIG. 5E). In this case, anisotropic etching is used to form vertical or substantially vertical walls of the second groove 207.

Figure 5F:
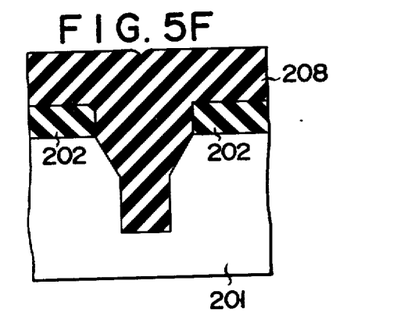
Figure 5G:
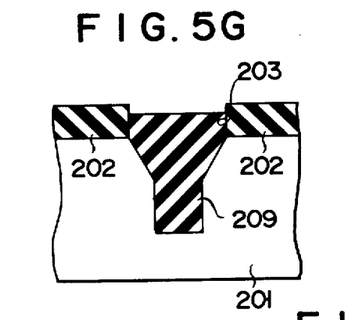

The mask patterns 206 on the tapered walls of the first groove 204 are etched by isotropic etching. An isolation region formation film 208 is deposited to cover the mask patterns 202 and the first and second grooves 204 and 207 to a thickness greater than half of the width of the first groove 204. Note that the first groove 204 is filled by the film 208 without forming a cavity therein (FIG. 5F). A means for forming the isolation region formation film 208 and the selection of an insulating material are both substantially the same as in FIG. 4G.

Figure 5H:
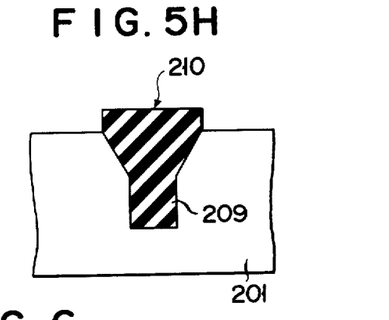
Figure 6:
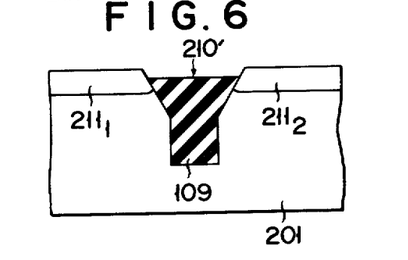

In the same manner as described with reference to FIGS. 4H and 4I, the isolation region formation film 208 is etched to expose the surfaces of the mask patterns and to leave an isolating material 209 in the first and second grooves 204 and 208 (FIG. 5G) and in the hole 203 of the mask film 202. The mask patterns 202 are then etched to form an element isolation region 210 which extends from the surface of the semiconductor substrate 201 (FIG. 5H). Even if an impurity region is formed adjacent to the element isolation region, the junction between the impurity region and the semiconductor substrate may not be exposed as explained above with reference to FIGS. 4. Thus, degradation of the junction characteristics can be prevented. As shown in FIG. 6, when impurity regions $211_1$ and $211_2$ are formed and the surface of an isolation region 210' is lower than the surfaces of the impurity regions $211_1$ and $211_2$, then, the depth of the junction between the surface of the semiconductor substrate 201 and the impurity region $211_1$ or $211_2$ of the semiconductor substrate 201 at the boundary of the element isolation region 210' becomes shallow. Therefore, if a metal electrode is deposited, the junctions are short-circuited. However, in the element isolation region 210 whose surface is higher than the main surface of the semiconductor substrate 201, short-circuiting in the junction may not occur.

Figure 7A:
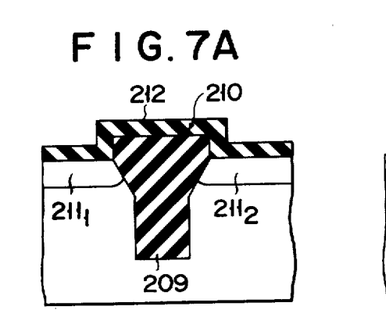
Figure 7B:
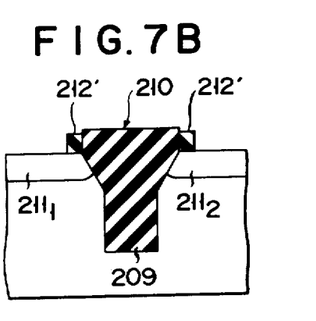

After the element isolation region 210 comprising the isolating material 209 and having a surface higher than the surface of the semiconductor substrate 201 is formed as shown in FIG. 5H, the junction of the impurity region on the semiconductor substrate which contacts the element isolation region 210 may not be short-circuited. As shown in FIG. 7A, the impurity regions $211_1$ and $211_2$ which contact the element isolation region 210 are formed, and an insulating film 212 such as an oxide film or a nitride film is deposited thereon. Anisotropic etching such as RIE is performed to leave insulating patterns 212' on the extending sides of the isolating material 209. The insulating patterns 212' cover the contact portions between the element isolation region 210 and the impurity regions $211_1$ and $211_2$ (FIG. 7B).

According to the method of the present invention, a tapered Y-shaped groove can be formed in a self-aligned manner. Further, the tapered portion of the Y-shaped groove need not be formed by overetching. Thus, a highly precise semiconductor device with a small element isolation region can be obtained with good controllability. A channel stopper region of a desired type of impurity can be formed on the side surfaces and the bottom surface of the tapered portion of the groove.

Figure 8A:
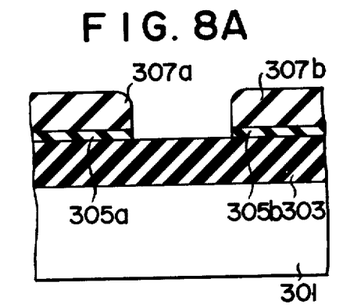
FIGS. 8A to 8G and FIGS. 9A to 9G are sectional views for explaining the steps of manufacturing contact holes of electrodes according to still further embodiments of the present invention.
Figure 8B:
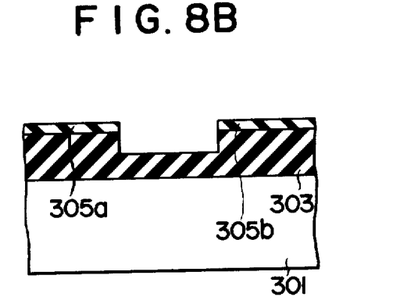
Figure 8C:
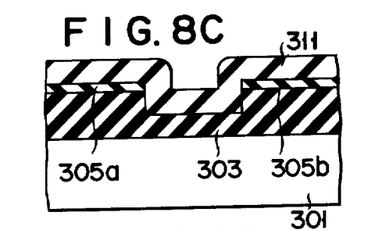
Figure 8D:
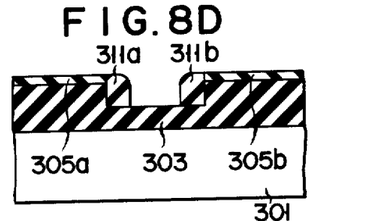
Figure 8E:
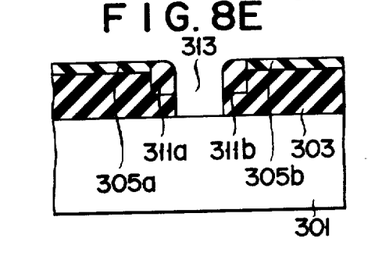
Figure 8F:
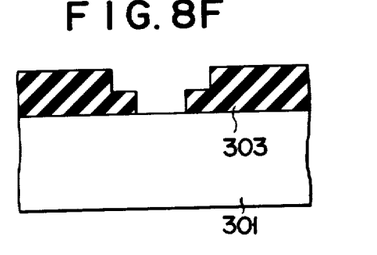
Figure 8G:
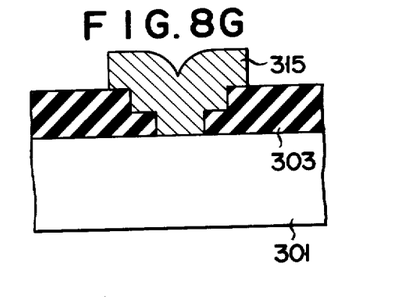

A case will be described with reference to FIGS. 8A to 8G in which a contact hole for an electrode region is formed. As shown in FIG. 8A, a field oxide film 303 and a first mask film 305 are sequentially formed on a semiconductor layer 301. The field oxide film 303 may comprise a silicon oxide film, a phosphorus silicate glass layer, a boron silicate glass layer or a composite film thereof. The first mask film 305 may comprise a silicon nitride film, any other insulating film, or a conductive film. Photoresist patterns 307a and 307b are formed on the first mask film 305. The first mask film is etched using the photoresist patterns 307a and 307b as masks to form first mask patterns 305a and 305b. As shown in FIG. 8B, the photoresist patterns 307a and 307b are etched and anisotropic etching such as RIE is performed to form a first groove in the field oxide film 303. The first groove may have a tapered shape as shown in FIG. 5B. Further, if needed, the surface layer of the groove may be changed into a passivation film. Further, as shown in FIG. 8C, a second mask film 311 which comprises a polycrystalline silicon film doped with phosphorus of a high concentration is formed to cover the entire surface to a thickness smaller than the width of the first groove. As shown in FIG. 8D, the second mask film 311 is etched by anisotropic etching such as RIE to a depth corresponding to the thickness of the second mask film. Thus, part of the second mask film 311 remains on the side surfaces of the first groove to form second mask patterns 311a and 311b. Most of the field oxide film 303 is covered by the first mask patterns 305a and 305b and the second mask patterns 311a and 311b, leaving only the bottom surface of the first groove exposed. The exposed portion of the field oxide film 303 on the bottom surface of the first groove is then etched as shown in FIG. 8E so that a second groove 313 is formed. Further, as shown in FIG. 8F, the first mask patterns 305a and 305b, and the second mask patterns 311a and 311b are respectively etched. Finally, an electrode 315 is deposited as shown in FIG. 8G. The electrode material is smoothly formed in the contact hole.

The surface of the field oxide film 303 does not allow contamination to enter from outside of the semiconductor device, when the field oxide film is doped with phosphorus of a high concentration and is formed into an amorphous state by high temperature annealing. In order to obtain a stable semiconductor device by this method, a passivation film must be formed. The side surfaces and the bottom surface of the first groove of the contact hole in this embodiment are not passivated. After the first groove of the contact hole is formed, phosphorus of a high concentration may be ion-implanted and annealed to change its surface layer to a passivation film. Alternatively, a thin silicon nitride film may be formed on the surface of the first groove.

A case will be described with reference to FIGS. 9A to 9G in which the surface layer of the first groove is changed to a passivation layer in simultaneous with the formation of an electrode contact hole.

Figure 9A:
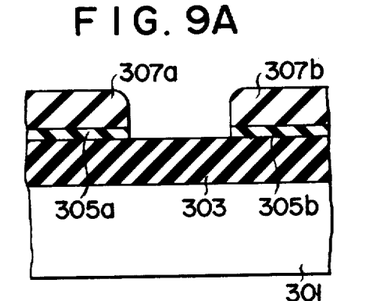
Figure 9B:
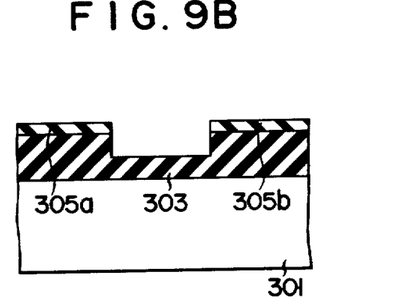
Figure 9C:
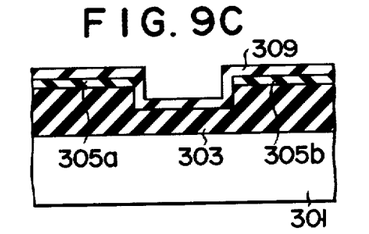
Figure 9D:
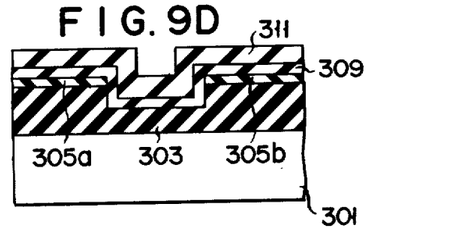
Figure 9E:
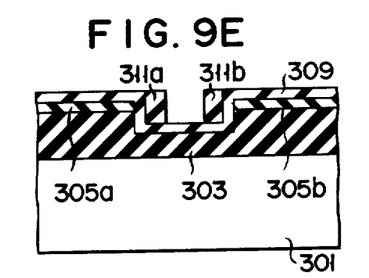
Figure 9F:
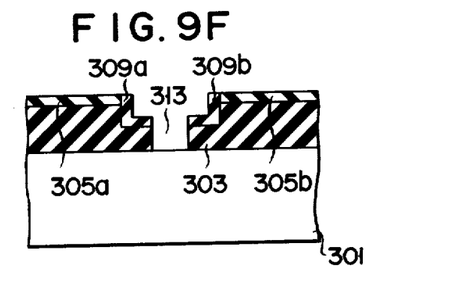
Figure 9G:
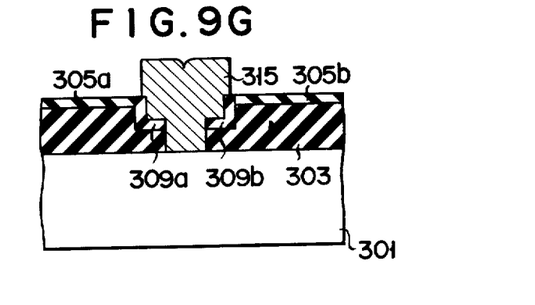

As shown in FIG. 9A, a field oxide film 303 and a first mask film 305 are sequentially formed on a semiconductor substrate 301. Photoresist patterns 307a and 307b which constitute an opening for a prospective contact hole are formed on the first mask film. The first mask film, which comprises a silicon nitride film, is etched using the photoresist patterns 307a and 307b as masks, so that first mask patterns 305a and 305b are formed. As shown in FIG. 9B, the photoresist patterns 307a and 307b are etched, and the field oxide film 303 is then etched using the first mask patterns 305a and 305b as masks, so that a first groove is formed. Thereafter, as shown in FIG. 9C, a passivation film 309 or a thin silicon nitride film 309 is deposited on the entire surface. Then, polycrystalline silicon film 311 containing phosphorus in high concentration, which works as a second masking material is deposited to cover the entire surface to a thickness smaller than half of the width of the first groove as shown in FIG. 9D. Anisotropic etching such as RIE is performed to selectively etch the second mask film 311 to leave that part of the polycrystalline film on the side walls of the first groove (FIG. 9E). As shown in FIG. 9F, the passivation film 309 is selectively etched using the second mask patterns (polycrystalline silicon) 311a and 311b as masks to expose part of the field oxide film 303 at the bottom surface of the first groove thereby forming a second groove 313. The passivation film 309 is etched at the bottom surface of the first groove to form passivation patterns 309a and 309b. Then, the bottom surface of the first groove is etched, thereby forming a second groove 313. Subsequently, the polycrystalline silicon 311a, 311b are selectively etched to leave a sequence of silicon nitride films 305a, 309a, 309b and 305b. Finally, an electrode 315 is deposited as shown in FIG. 9G. The first mask patterns 305a and 305b and the second mask patterns 309a and 309b are effectively used as excellent passivation films. As a result, a high-performance semiconductor device is obtained with high reliability.

Examples of the present invention will be described below. In Example 1, a vertical npn bipolar transistor is manufactured according to the method of the present invention.

EXAMPLE 1

Figure 10A:
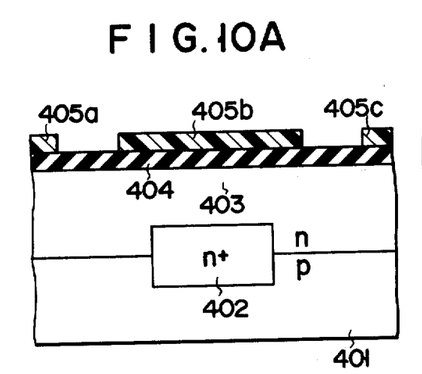
FIGS. 10A to 10F, FIGS. 11A to 11D and FIGS. 12A to 12H are respectively sectional views for explaining the steps of manufacturing a vertical npn bipolar transistor, a CMOSFET, and an n-channel MOSLSI according to still further embodiments of the present invention.

(i) An n+-type buried layer 402 was formed in a p-type semiconductor substrate 401, and an n-type epitaxial layer 403 was then grown thereon. A silicon nitride film 404 was then deposited by chemical vapor deposition (CVD) on the n-type epitaxial layer 403. Photoresist patterns 405a to 405c were formed by photoetching on the silicon nitride film 404 excluding a prospective element isolation region (FIG. 10A).

Figure 10B:
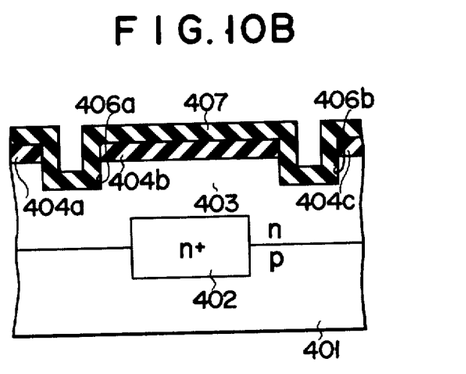
Figure 10C:
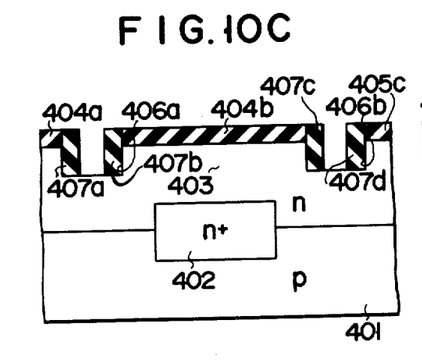

(ii) The silicon nitride film 404 and the n-type epitaxial layer 403 were sequentially etched using the photoresist patterns 405a to 405c as masks so that first grooves 406a and 406b of about 2 μm width and 1.5 μm depth were formed in the n-type epitaxial layer 403. A CVD-$SiO_2$ film which was used to form a mask film 407 was deposited to cover the entire surface to a thickness of about 5,000Å (FIG. 10B). Anisotropic etching such as RIE was performed to selectively etch the CVD-$SiO_2$ film 407 to retain CVD-$SiO_2$ patterns 407a to 407d (mask patterns) on the walls of the first grooves 406a and 406b (FIG. 10C). At this time, portions of the n-type epitaxial layer 403 were selectively exposed along the bottom surfaces of the first grooves 406a and 406b respectively.

Figure 10D:
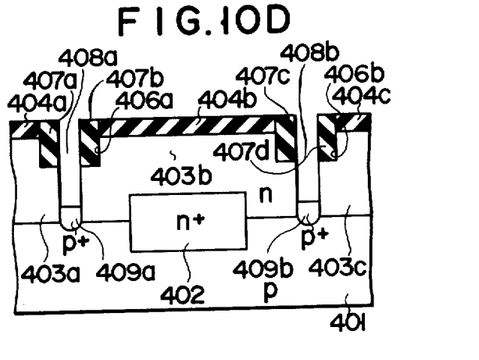
Figure 10E:
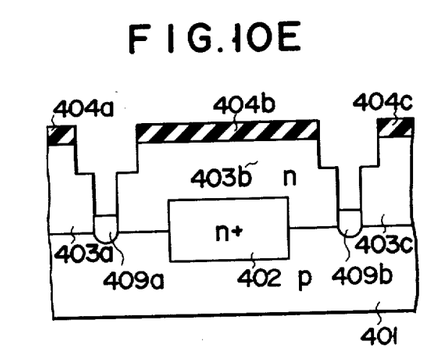

(iii) The exposed portions of the n-type epitaxial layer 403 were etched using the silicon nitride patterns 404a to 404c and the CVD-$SiO_2$ patterns 407a to 407d as masks, so that second grooves 408a and 408b were formed, defining n-type epitaxial regions 403a to 403c. Further, using the same masks, boron was ion-implanted to form p+-type regions 409a and 409b in the bottom surfaces of the second grooves 408a and 408b respectively (FIG. 10D). The p+-type regions 409a and 409b functioned as channel stoppers and reached the p-type semiconductor substrate 401. Subsequently, as shown in FIG. 10E, the CVD-$SiO_2$ patterns 407a to 407d were etched by an ammonium fluoride etchant.

Figure 10F:
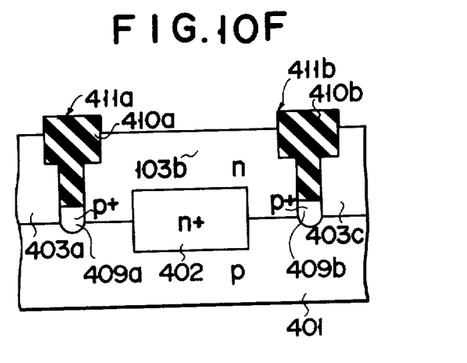

(iv) A CVD-$SiO_2$ film which was used for forming an isolation region was deposited on the silicon nitride patterns 404a to 404c and on the walls and bottom surfaces of the first grooves 406a and 406b and the second grooves 408a and 408b. The thickness of the $SiO_2$ film was greater than the width of the first grooves 406a and 406b. The SiO$_2$ film was etched to expose the silicon nitride patterns 404a to 404c and to retain CVD-SiO$_2$ regions 410a and 410b in the first grooves 406a and 406b and in the second grooves 408a and 408b. Thus, element isolation regions 411a and 411b were formed. Subsequently, the exposed silicon nitride patterns 404a to 404c were etched by plasma etching (FIG. 10F). In accordance with a conventional process which is not illustrated, a p-type base region was formed in the n-type epitaxial region 403b which was isolated by the p$^+$-type regions 409a and 409b and the element isolation regions 411a and 411b. An n$^+$-type emitter region was formed in the base region. An n$^+$-type collector region was formed in the n-type epitaxial layer 403a. Further, aluminum electrodes of the base, emitter and collector regions were deposited to complete a vertical npn bipolar transistor. According to Example 1, the following effects are obtained:

(1) The grooves of the element isolation regions 411a and 411b comprise the first grooves 406a and 406b, and the second grooves 408a and 408b which are etched using as masks the CVD-SiO$_2$ patterns 407a to 407d retained on the side walls of the first grooves 406a and 406b. Since the width of the first groove is greater than that of the second groove, no cavity is formed in the isolation region formation film. Therefore, the isolating material remains in the grooves, so that the element isolation regions 411a and 411b are very reliably formed with excellent insulating resistance.

(2) Since the area of the element isolation regions 411a and 411b is determined by the first grooves 406a and 406b and by the second grooves 408a and 408b (though mainly by the first grooves), which are formed in the n-type epitaxial layer 403, the area of the grooves may be made small to obtain desired small element isolation regions 411a and 411b. As a result, a highly integrated bipolar transistor can be obtained.

(3) Since the depth of the element isolation regions 411a and 411b is determined by the depth of the first grooves 406a and 406b and of the second grooves 408a and 408b independently of their area, the depth can be arbitrarily selected. No leakage current flows between the semiconductor elements because of the presence of the element isolation regions 411a and 411b. As a result, a high-performance bipolar transistor can be obtained.

(4) Since the second grooves 408a and 408b can be formed in a self-aligned manner with respect to the CVD-SiO$_2$ patterns retained on the walls of the first grooves 406a and 406b, the p$^+$-type regions 409a and 409b acting as channel stoppers can be formed in the n-type epitaxial layer 403 in such a manner that the regions 409a and 409b are spaced apart from the first grooves 406a and 406b by a thickness of the CVD-SiO$_2$ patterns 407a to 407d. Further, the n$^+$-type buried layer 402 can be spaced apart from the p$^+$-type regions 409a and 409b by a predetermined distance. As a result, breakdown voltage at the junction may not be degraded.

(5) Since conventional selective oxidation with long high temperature annealing need not be performed after the p$^+$-type regions 409a and 409b are formed, impurities in the p$^+$-type regions 409a and 409b may not be transversely diffused and may not reach the n$^+$-type buried layer of the prospective element isolation region and the active region of the transistor. Therefore, the effective element formation region can be sufficiently large. In this case, if impurities are ion-implanted, impurity regions may be formed in the bottom of the second grooves 408a and 408b. Further, even if the impurity in the impurity regions is diffused, it does not reach the surface layer (transistor active portion) of the element isolation region, so that the effective region for forming the element may not be decreased. At the same time, diffusion of the impurity into the transistor active portion can also be prevented.

(6) Since the surface of semiconductor substrate becomes flat when the isolating material remains in the first grooves 406a and 406b and the second grooves 408a and 408b to form the element isolation regions 411a and 411b excellent step coverage is guaranteed.

The following example describes the manufacture of a CMOSFET according to the present invention.

EXAMPLE 2

Figure 11A:
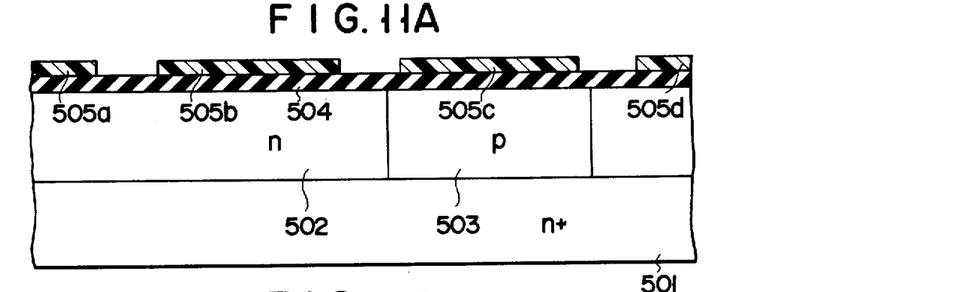

(i) After an n-type epitaxial layer 502 was grown on an n$^+$-type semiconductor substrate 501, boron was selectively ion-implanted into the n-type epitaxial layer 502. Thereafter, annealing was performed to diffuse the impurity to form a p-type semiconductor region 503. A silicon nitride film 504 was then deposited by the CVD method to cover the entire surface, and photoresist patterns 505a to 505d were formed on the silicon nitride film 504 excluding the prospective element isolation regions (FIG. 11A).

Figure 11B:
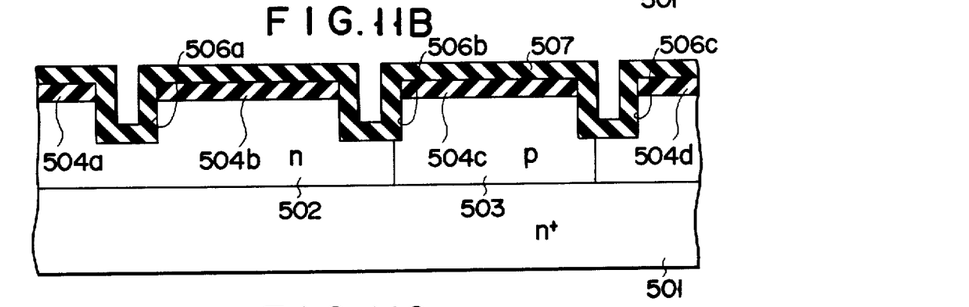

(ii) The silicon nitride film 504 and the n-type epitaxial layer 502 were sequentially etched by reactive ion etching using the photoresist patterns 505a to 505d as masks, so that first grooves 506a to 506c were formed. Subsequently, a CVD-SiO$_2$ film 507 was deposited to a thickness less than half of the width of the first grooves 506a to 506b (FIG. 11B).

(iii) The CVD-SiO$_2$ film was then etched by the RIE method to retain CVD-SiO$_2$ patterns (not shown) on the side walls of the first grooves 506a to 506d. Using the silicon nitride patterns 504a to 504d and the CVD-SiO$_2$ patterns as masks, the exposed portions of the n-type epitaxial layer 502 at the bottom surfaces of the first grooves 506a to 506c were etched to form second grooves 508a to 508c, thus defining n-type epitaxial regions 502a and 502b. Further, using the same masks, arsenic was ion-implanted to form n$^+$-type regions 509a to 509c in the bottom surfaces of the second grooves 508a to 508c respectively. The n$^+$-type regions 509a to 509c functioned as channel stoppers and reached the n$^+$-type semiconductor substrate 501. Subsequently, the CVD-SiO$_2$ patterns (not shown) were etched by an ammonium fluoride etchant.

Figure 11C:
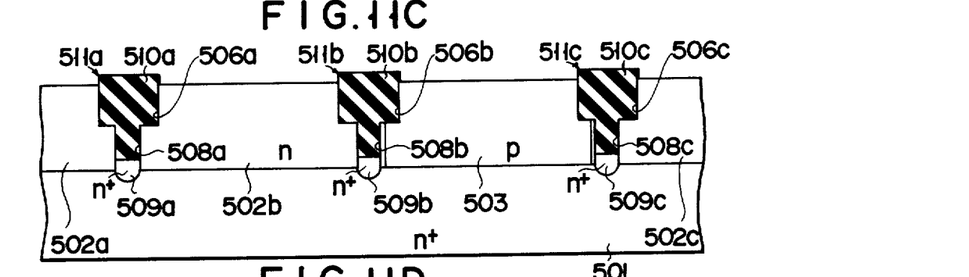

A CVD-SiO$_2$ film (not shown) was deposited to cover the entire surface to a thickness sufficiently greater than the width of the first groove 505a to 505c. The CVD-SiO$_2$ film (not shown) was etched to expose the silicon nitride patterns 504a to 504d, and to retain CVD-SiO$_2$ regions 510a to 510c as the isolating material in the first grooves 506a to 506c and in the second grooves 508a to 508c. As a result, element isolation regions 511a to 511c were formed. Thereafter, the exposed silicon nitride patterns 504a to 504c were etched by plasma etching (FIG. 11C).

(iv) Thermal oxidation was then performed to grow a thermal oxide film 512 on the n-type epitaxial layer 502. A polycrystalline silicon film was deposited to cover the entire surface and was patterned. Thereafter, gate electrodes 513$_1$ and 513$_2$ were respectively formed on the n-type epitaxial region 502b which was isolated by the element isolation regions 511a and 511b and on the p-type semiconductor region 503 which was isolated by the element isolation regions 511b and 511c. Then photoresist patterns (not shown) were formed except on the n-type epitaxial layer 502 and on the p-type semiconductor region 503. After these photoresist patterns (not shown) were formed, the thermal oxide film 512 was etched using the photoresist patterns (not shown) and the gate electrodes 513$_1$ and 513$_2$, so that gate oxide films 514$_1$ and 514$_2$ were formed.

Figure 11D:
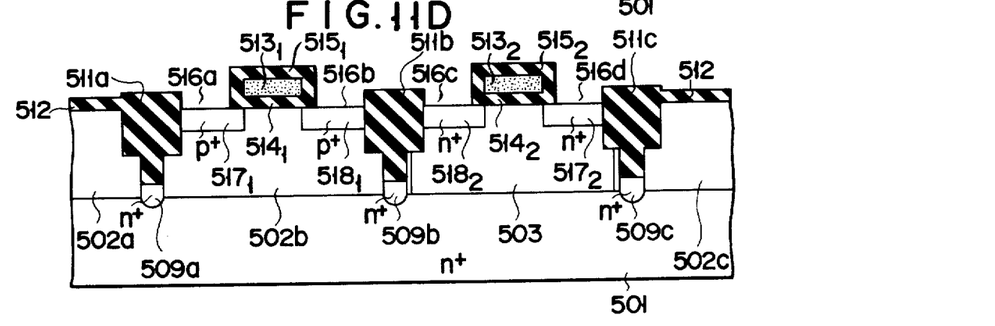

Subsequently, low-temperature thermal oxidation was performed to grow thin silicon oxide films (not shown) on the exposed portions of the n-type epitaxial layer and to form thick oxide films 515$_1$ and 515$_2$ around the gate electrodes 513$_1$ and 513$_2$ of polycrystalline silicon. The thin silicon oxide films were then etched to form contact holes 516a to 516d. Further, boron was ion-implanted in the n-type epitaxial layer 502 using the gate electrode 513$_1$ and a photoresist film (not shown) as masks. The impurity was then activated and diffused to form p+-type source and drain regions 517$_1$ and 518$_1$ respectively. Similarly, arsenic was ion-implanted in the p-type semiconductor region 503 using the gate electrode 513$_2$ and the photoresist film (not shown) as masks. The impurity was then activated and diffused to form n+-type source and drain regions 517$_2$ and 518$_2$ respectively (FIG. 11D). Although the following process is not illustrated, aluminum electrodes were deposited in accordance with the conventional process to contact the source and drain regions through the contact holes 516a to 516d. As a result, a CMOS field effect transistor was prepared.

According to the above method for manufacturing the CMOSFET, since the p-channel MOSFET can be isolated from the n-channel MOSFET by the CVD-SiO$_2$ regions 510a to 510c which constitute the element isolation regions 511a to 511c, the breakdown voltage of the junction between the p+-type source region 517$_1$ (or the drain region 518$_1$) and the n+-type source region 517$_2$ (or the drain region 518$_2$) in increased. Further, a highly integrated CMOSFET can be obtained. A parasitic pnp transistor, whose emitter is the p+-type source region 517$_1$ (or the drain region 518$_1$), whose base is the n-type semiconductor region 502b which contacts the semiconductor substrate 510, and whose collector is the p-type semiconductor region 503, the element isolation region 511b and the n+-type region 509b, functions to prevent injection of minor carriers into the emitter. Therefore, the current amplification factor of the pnp transistor is controlled, and hence the "latch-up" phenomenon conventionally inherent in the CMOSFET can be avoided.

EXAMPLE 3

A case will now be described with reference to FIGS. 12A to 12H in which the present invention is applied to the manufacture of an n-channel MOSLSI.

Figure 12A:
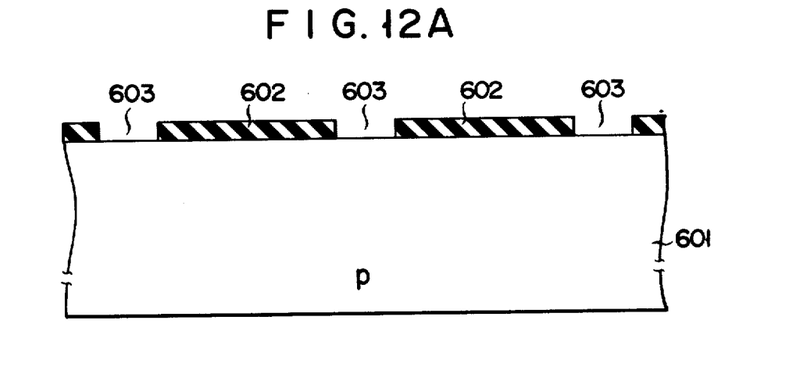
Figure 12B:
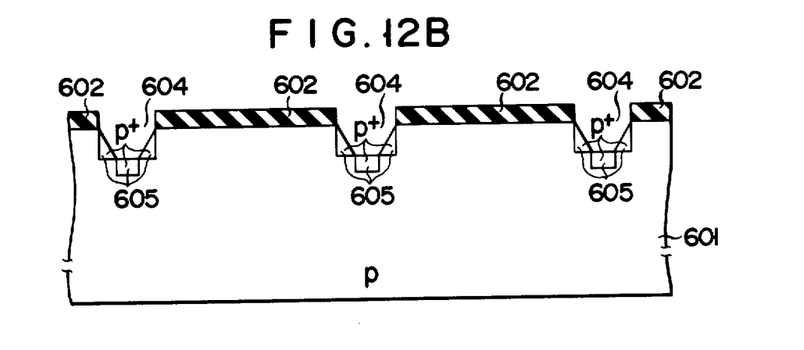

(i) After a silicon nitride film was deposited on the entire surface of a p-type silicon substrate 601, anisotropic etching such as reactive ion etching was performed to form holes 603 corresponding to prospective groove formation regions (FIG. 12A). Subsequently, exposed portions of the silicon substrate 601 were etched by anisotropic etching using a KOH type etchant and using the silicon nitride patterns 602 as masks to form first grooves 604 having a tapered or inverted trapezoidal shape. Boron was then ion-implanted in the first grooves 604 using the silicon nitride patterns 602 as masks. The impurity was activated and diffused to form p+-type channel stoppers 605 along the walls and the bottom surface forming the tapered grooves 604 (FIG. 12B).

Figure 12C:
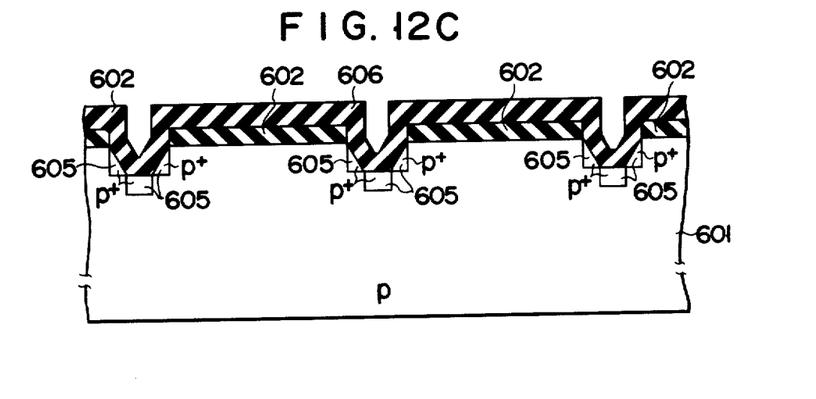
Figure 12D:
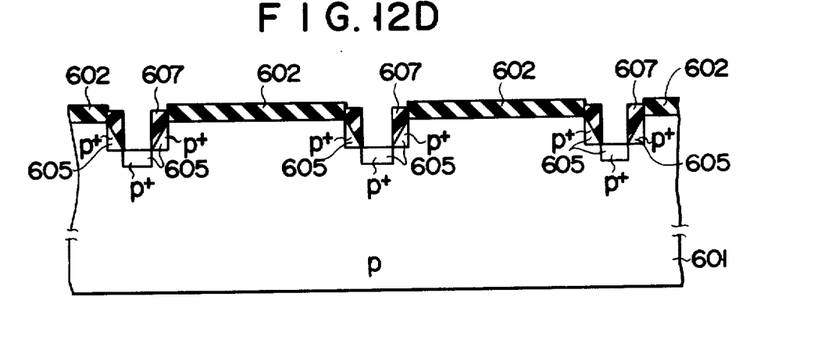

(ii) A CVD-SiO$_2$ film 606 was then deposited to cover the entire surface to a thickness smaller than half of the width of the first grooves 604 (FIG. 12C). Anisotropic etching such as reactive ion etching was performed to selectively etch the CVD-SiO$_2$ film 606 to retain CVD-SiO$_2$ patterns (mask patterns) 607 in the holes 603 of the silicon nitride patterns 602 and along the side walls of the first grooves 604. Those portions of the silicon substrate 601 acting as channel stoppers 605 were thus exposed (FIG. 12D).

Figure 12E:
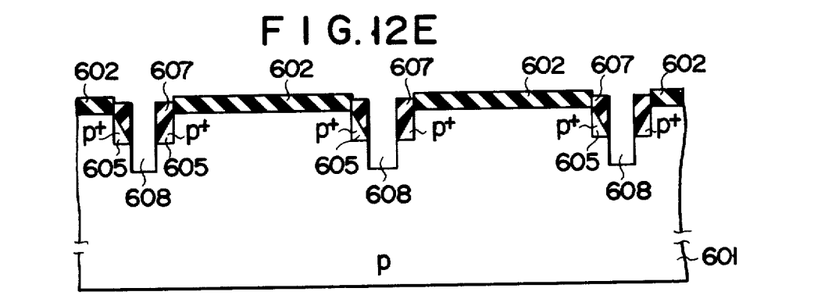

(iii) The exposed portions of the silicon substrate 601 at the bottom surfaces of the first grooves 604 were etched using the CVD-SiO$_2$ patterns 607 as masks, so that second grooves 608 were formed (FIG. 12E). Those portions of the channel stoppers 605 which corresponded to the bottom surfaces of the first grooves 604 were etched, leaving only those portions of the channel stoppers 605 on the side walls of the grooves 604.

Figure 12F:
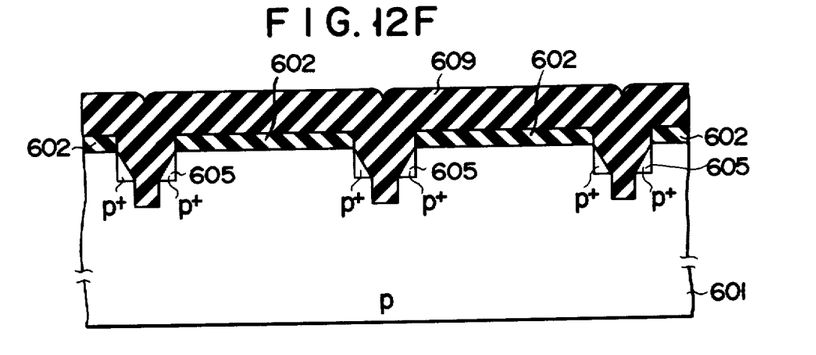
Figure 12G:
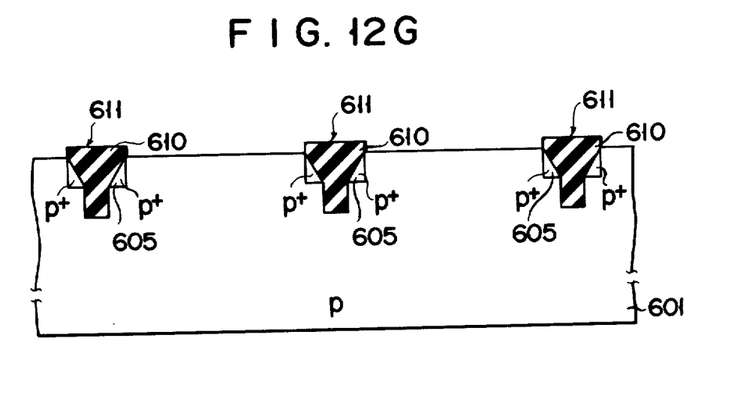

(iv) The remaining portions of the CVD-SiO$_2$ patterns 607 were etched by an ammonium fluoride etchant, and a CVD-SiO$_2$ film 609 was deposited to cover the first and second grooves 604 and 608 and the silicon nitride patterns 602 to a thickness sufficiently greater than the width of the first groove 604 (FIG. 12F). The CVD-SiO$_2$ film 609 was then etched to expose the surfaces of the silicon nitride patterns 602, such that CVD-SiO$_2$ was retained in the first and second grooves 604 and 608. Thereafter, the silicon nitride patterns 602 were etched by plasma etching. As a result, element isolation regions 611 having isolation portions 610 of CVD-SiO$_2$ were formed (FIG. 12G).

Figure 12H:
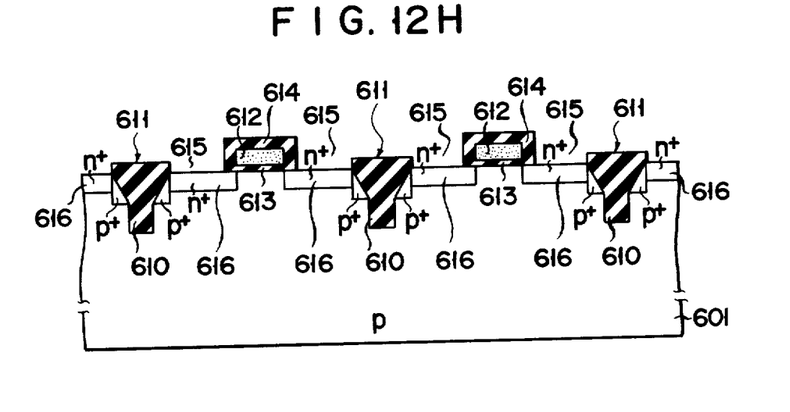

(v) A thermal oxide film was formed on those island regions of the silicon substrate 601 isolated by the element isolation regions 611. An arsenic-treated polycrystalline silicon layer was then deposited on the thermal oxide film and was patterned to form a plurality of gate electrodes 612. The thermal oxide film was etched using the gate electrodes 612 as a mask, so that gate oxide films 613 were formed. Thereafter, low-temperature thermal oxidation was performed to grow thick oxide film 614 around the gate electrodes 612 of arsenic-doped polycrystalline silicon and to form thin oxide films (not shown) on the exposed surfaces of the silicon substrate 601. The thin oxide films were etched to form contact holes and openings 615 which functioned as windows for impurity doping. An n-type impurity such as arsenic was ion-implanted using the element isolation regions 611 and the gate electrodes 612 as masks. The impurity was then activated and diffused to form n+-type regions 616 which were used as source and drain regions in the p-type silicon substrate 601. As a result, an n-channel MOSLSI was prepared (FIG. 12H).

According to the above example, the following effects are obtained:

(1) The side walls of the groove which corresponds to the element isolation region 611 comprise the walls of the first groove 604 of a tapered shape and of the second groove 608 which is formed in a self-aligned manner using the CVD-SiO$_2$ patterns remaining on the side surfaces of the groove 604 as a mask. Since the diameter of the first groove is greater than that of the second groove, no cavity is formed in the isolation region formation film. When the isolating material is retained in the grooves, a highly reliable element isolation region 611 can be formed with a high breakdown voltage.

(2) Since the area of the element isolation region 611 is mainly determined by the first groove 604 formed in the silicon substrate 601, and since the groove 604 is very precisely etched using the silicon nitride pattern 602 with the hole 603, the area of the first and second grooves can be made small, so that a desired small element isolation region can be formed. As a result, a highly integrated MOSLSI can be obtained.

(3) Since the depth of the element isolation region 611 can be determined by the depth of the first and second grooves formed in the silicon substrate 601 independently of the area of the grooves, the depth can be arbitrarily determined. Further, no leakage current may flow between the semiconductor elements because of the presence of the p+-type channel stopper formed on the side walls of the tapered portion of the first groove. Thus, a high-performance MOSLSI can be obtained.

(4) Since an impurity such as boron is ion-implanted using the silicon nitride patterns 602 as masks after the first grooves 604 are formed, the p+-type channel stoppers can be formed on the side walls of the tapered portion of the first groove.

(5) Since the surface of the element isolation region extends above that of the silicon substrate, the junctions formed by the n+-type regions 616 as the source and drain in the vicinity of the element isolation region 611 may not be exposed on the surface of the silicon substrate. The junctions of the source and drain wirings may not be short-circuited. Thus, a highly reliable MOSLSI can be obtained.

What is claimed is:

1. A method for forming an isolation region for a semiconductor device, comprising the steps of:
    (a) selectively forming a first groove in a semiconductor layer or in an insulating layer which is formed on a semiconductor layer;
    (b) depositing a mask pattern-forming thin film on said semiconductor layer including the side wall and the bottom surface of said first groove and vertically etching said mask pattern-forming thin film by anisotropic etching to form a first mask pattern;
    (c) forming a second groove narrower than said first groove be selectively etching a bottom surface of said first groove using said first mask pattern as a mask;
    (d) etching said first mask pattern retained on the said wall of said first groove; and
    (e) filling said first and second grooves with isolating material.

2. A method according to claim 1, wherein the wall of said first groove is tapered by selective etching in step (a).

3. A method according to claim 1, wherein the wall of said first groove is formed substantially vertical by anisotropic etching in step (a).

4. A method according to claim 1, wherein at least part of said first groove is oxidized or nitrified before said first and second grooves are filled with isolating material.

5. A method according to claim 1, wherein impurities are ion-implanted in a bottom surface of said second groove while said second mask pattern is retained in said first groove.

6. A method according to claim 1, wherein a third groove, whose width is smaller than a width of said second groove, is formed using another mask pattern as a mask to form a multi-step groove structure after said second groove is formed.

7. A method according to claim 1, wherein said step of depositing includes the step interposing another mask pattern-forming film on said semiconductor layer including the side wall and the bottom surface of said first groove, or on said insulating layer and vertically etching said another mask pattern-forming film to form said first mask pattern.

8. A method according to claim 1, wherein said isolating material filling said first and second grooves of said semiconductor layer or said insulating layer also fills an aperture in another mask pattern on said semiconductor layer or said insulating layer.

9. A method according to claim 8, wherein said isolating material extends above said semiconductor layer or said insulating layer.

10. A method according to claim 9, wherein another isolating material is deposited and etched to be retained only on side surfaces of said semiconductor layer or insulating layer adjoining said extended portion of said isolation material.

11. A method according to claim 1, wherein said first and second grooves are formed around the well of a C-MOS device, and said isolation material prevents the injection of minority carriers and the generation of latch-up phenonemon.

12. A method for manufacturing an element of a semiconductor device, comprising the steps of:
    (a) sequentially forming a field oxide film and a first mask pattern-forming thin film on a semiconductor substrate or semiconductor layer;
    (b) depositing a photoresist mask on said mask pattern-forming thin film;
    (c) etching said thin film and said field oxide film photoresist mask to form a first groove in said field oxide film;
    (d) depositing a second mask pattern-forming thin film on said field oxide film including the side wall and the bottom surface of said first groove and vertically etching said second mask pattern-forming thin film by anisotropic etching to form a second mask pattern;
    (e) forming a second groove narrower than said first groove by selectively etching a bottom surface of said first groove using said second mask pattern as a mask;
    (f) etching said second mask pattern retained on the side wall of said first groove; and
    (g) depositing electrode material in said first and second grooves.

13. A method according to claim 12, wherein a passivation film is formed in said first groove after said first groove is formed.

* * * * *